US012751051B2

(12) United States Patent
Jeong et al.

(10) Patent No.: US 12,751,051 B2
(45) Date of Patent: Sep. 29, 2026

(54) THIN FILM TRANSISTOR INCLUDING REDUCING PATTERN, FABRICATING METHOD THEREOF AND DISPLAY DEVICE COMPRISING THE SAME

(71) Applicant: LG Display Co., Ltd., Seoul (KR)

(72) Inventors: ChanYong Jeong, Paju-si (KR); KyungChul Ok, Paju-si (KR); Dohyung Lee, Paju-si (KR); HongRak Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 633 days.

(21) Appl. No.: 17/962,783

(22) Filed: Oct. 10, 2022

(65) Prior Publication Data

US 2023/0110764 A1 Apr. 13, 2023

(30) Foreign Application Priority Data

Oct. 12, 2021 (KR) ........................ 10-2021-0135254

(51) Int. Cl.
*H10D 30/67* (2025.01)
*H10D 30/01* (2025.01)
*H10K 59/12* (2023.01)

(52) U.S. Cl.
CPC ....... *H10D 30/6757* (2025.01); *H10D 30/031* (2025.01); *H10D 30/6729* (2025.01); *H10D 30/6755* (2025.01); *H10K 59/12* (2023.02)

(58) Field of Classification Search
CPC ............. H10D 30/6757; H10D 30/031; H10D 30/6729; H10D 30/6755; H10D 30/673;
(Continued)

(56) References Cited

U.S. PATENT DOCUMENTS

2015/0053969 A1* 2/2015 Ito ........................ H10D 64/257 257/43
2016/0141422 A1* 5/2016 Matsubayashi .... H10D 30/6755 257/43

(Continued)

FOREIGN PATENT DOCUMENTS

JP 2020-053529 A 4/2020
KR 10-2013-0055329 A 5/2013

(Continued)

OTHER PUBLICATIONS

Office Action dated Nov. 13, 2024, issued in corresponding Korean Patent Application No. 10-2021-0135254.

(Continued)

*Primary Examiner* — Duy T Nguyen
*Assistant Examiner* — Jiyoung Oh
(74) *Attorney, Agent, or Firm* — Morgan, Lewis & Bockius LLP

(57) ABSTRACT

A thin film transistor, a fabricating method of the thin film transistor and a display device including the thin film transistor are provided, in which the thin film transistor includes a reducing pattern on a substrate, an active layer that is in contact with the reducing pattern, and a gate electrode at least partially overlapped with the active layer, wherein the active layer includes a channel portion, a first conductorization portion connected to one side of the channel portion, and a second conductorization portion connected to the other side of the channel portion, and the channel portion overlaps the gate electrode and does not overlap the reducing pattern.

21 Claims, 12 Drawing Sheets

(58) Field of Classification Search
CPC .. H10D 30/6713; H10D 86/423; H10D 86/60; H10D 64/62; H10K 59/12; H10K 59/1213
USPC .......................................................... 257/288
See application file for complete search history.

(56) References Cited

U.S. PATENT DOCUMENTS

| | | | | |
|---|---|---|---|---|
| 2016/0254334 | A1* | 9/2016 | Yang | H10D 30/6704 257/40 |
| 2018/0226498 | A1* | 8/2018 | Sasaki | H10D 30/6706 |
| 2020/0098933 | A1* | 3/2020 | Tanaka | H10D 30/6756 |
| 2021/0313470 | A1* | 10/2021 | Ji | H10D 30/6733 |

FOREIGN PATENT DOCUMENTS

| | | | | | |
|---|---|---|---|---|---|
| KR | 20130055329 | A | * | 5/2013 | H10D 30/6755 |
| KR | 20140143575 | A | | 12/2014 | |
| KR | 10-2016-0104772 | A | | 9/2016 | |
| KR | 20200078094 | | * | 7/2020 | |
| KR | 20210035694 | | * | 4/2021 | H10D 30/6757 |

OTHER PUBLICATIONS

Office Action issued in corresponding Korean Patent Application No. 10-2021-0135254, dated Jun. 17, 2025. (Note: KR 10-2013-0055329 A, JP 2020-053529 A were previously cited.).
Office Action dated Mar. 3, 2026, issued in corresponding Chinese Patent Application No. 202211210309.4. (Note: US 2016/0254334 A1, KR 10-2013-0055329 A, and KR 10-2021-0035694 A).

* cited by examiner

THIN FILM TRANSISTOR INCLUDING REDUCING PATTERN, FABRICATING METHOD THEREOF AND DISPLAY DEVICE COMPRISING THE SAME

CROSS-REFERENCE TO RELATED APPLICATIONS

This application claims the benefit of priority of the Korean Patent Application No. 10-2021-0135254 filed on Oct. 12, 2021, which is hereby incorporated by reference as if fully set forth herein.

BACKGROUND

Technical Field

The present disclosure relates to a thin film transistor, a fabricating method thereof and a display device comprising the same.

Discussion of the Related Art

Transistors are widely used as switching devices or driving devices in the field of electronic devices. In particular, since a thin film transistor can be fabricated on a glass substrate or a plastic substrate, the thin film transistor is widely used as a switching device of a display device such as a liquid crystal display device or an organic light emitting display device.

The thin film transistor may be categorized into an amorphous silicon thin film transistor in which amorphous silicon is used as an active layer, a polycrystalline silicon thin film transistor in which polycrystalline silicon is used as an active layer and an oxide semiconductor thin film transistor in which oxide semiconductor is used as an active layer, based on a material constituting the active layer.

Since amorphous silicon may be deposited in a short time to form an active layer, an amorphous silicon thin film transistor (a-Si TFT) has advantages in that a fabricating process time is short and a production cost is low. On the other hand, the amorphous silicon thin film transistor has a drawback in that it is restrictively used for an active matrix organic light emitting diode (AMOLED) because a current driving capacity is not good due to low mobility and there is a change in a threshold voltage.

A polycrystalline silicon thin film transistor (poly-Si TFT) is made by depositing amorphous silicon and crystallizing the deposited amorphous silicon. The polycrystalline silicon thin film transistor has advantages in that electron mobility is high, stability is excellent, thin profile and high resolution may be embodied, and power efficiency is high. Examples of the polycrystalline silicon thin film transistor include a low temperature poly silicon (LTPS) thin film transistor or a polysilicon thin film transistor. However, since a process of fabricating the polycrystalline silicon thin film transistor needs a step of crystallizing the amorphous silicon, a fabricating cost is increased due to the increased number of the process steps, and crystallization is required at a high temperature. Therefore, it is difficult to apply the polycrystalline silicon thin film transistor to a large-sized display device. It is also difficult to make sure of uniformity of the polycrystalline silicon thin film transistor due to polycrystalline characteristics.

An oxide semiconductor thin film transistor (TFT), which has high mobility and has a large resistance change in accordance with an oxygen content, has an advantage in that desired properties may be easily obtained. Further, since an oxide constituting an active layer may be grown at a relatively low temperature during a process of fabricating the oxide semiconductor thin film transistor, the fabricating cost of the oxide semiconductor thin film transistor is reduced. Furthermore, in view of the properties of oxide, since an oxide semiconductor is transparent, it is favorable to embody a transparent display. However, the oxide semiconductor thin film transistor has a problem in that stability and mobility are deteriorated as compared with the polycrystalline silicon thin film transistor.

When an oxide semiconductor thin film transistor is fabricated in a coplanar structure called a top gate type, a conductorization area is formed. The oxide semiconductor thin film transistor may be degraded in the process of forming the conductorization area, and when there is a deviation in the conductorization area, reliability of the oxide semiconductor thin film transistor may be deteriorated. Therefore, it is important to control the conductorization area in the oxide semiconductor thin film transistor.

SUMMARY

Accordingly, embodiments of the present disclosure are directed to a thin film transistor, a fabricating method thereof and a display device comprising the same that substantially obviates one or more of the problems due to limitations and disadvantages of the related art.

An aspect of the present disclosure is to provide a thin film transistor that includes a conductorization portion formed as an active layer is selectively conductorized by a reducing pattern.

Another aspect of the present disclosure is to provide a thin film transistor in which an active layer is selectively conductorized by a reducing pattern so that a size and position of a conductorization portion formed by the active layer are elaborately controlled to obtain excellent reliability.

Another aspect of the present disclosure is to provide a thin film transistor in which a position of a reducing pattern is controlled so that a diffusion portion is formed between a channel portion and a conductorization portion of an active layer, thereby preventing an edge of the channel portion from being necessarily conductorized and thus elaborately controlling a length of the channel portion.

Another aspect of the present disclosure is to provide a fabricating method of a thin film transistor that may control a conductorization portion of an active layer by a reducing pattern.

Another object of the present disclosure is to provide a display device comprising the above thin film transistor to have excellent reliability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a thin film transistor comprises a reducing pattern on a substrate, an active layer that is in contact with the reducing pattern, and a gate electrode at least partially overlapped with the active layer, wherein the active layer includes a channel portion, a first conductorization portion connected to one side of the channel portion, and a second conductorization portion connected to the other side of the channel portion, and the channel portion overlaps the gate electrode and does not overlap the reducing pattern.

The reducing pattern is disposed between the substrate and the active layer.

The reducing pattern may be in contact with at least one of the first conductorization portion or the second conductorization portion.

The reducing pattern may include a first reducing pattern that is in contact with the first conductorization portion and a second reducing pattern that is in contact with the second conductorization portion.

The reducing pattern may not overlap the gate electrode.

The reducing pattern may include at least one selected from a silicon nitride, a silicon oxynitride, a silicon oxide, a silicon hydrogen oxide, aluminum (Al), titanium (Ti), molybdenum (Mo), calcium (Ca) or barium (Ba).

The active layer may include at least one of a first diffusion portion between the channel portion and the first conductorization portion or a second diffusion portion between the channel portion and the second conductorization portion.

The first diffusion portion and the second diffusion portion may not overlap the gate electrode.

The first diffusion portion may have specific resistance smaller than that of the channel portion and greater than that of the first conductorization portion, and the second diffusion portion may have specific resistance smaller than that of the channel portion and greater than that of the second conductorization portion.

The thin film transistor may further comprise a gate insulating layer between the active layer and the gate electrode, wherein the gate insulating layer may cover the channel portion, the first conductorization portion and the second conductorization portion.

The active layer may include an oxide semiconductor material.

The oxide semiconductor material may include at least one of an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material.

The active layer may include a first oxide semiconductor layer, and a second oxide semiconductor layer on the first oxide semiconductor layer.

The active layer may further include a third oxide semiconductor layer on the second oxide semiconductor layer.

The thin film transistor may further include a source electrode electrically connected to the active layer, and a drain electrode spaced apart from the source electrode and electrically connected to the active layer.

The source electrode and the drain electrode are disposed on the same layer as the gate electrode.

The source electrode may contact the first conductorization portion through a contact hole, and the drain electrode may contact the second conductorization portion through another contact hole.

In another aspect, a fabricating method of a thin film transistor comprises forming a reducing pattern on a substrate, forming an active layer that is in contact with the reducing pattern, and forming a gate electrode at least partially overlapped with the active layer, wherein the active layer includes a channel portion, a first conductorization portion connected to one side of the channel portion, and a second conductorization portion connected to the other side of the channel portion, the gate electrode is formed to overlap the channel portion, and the channel portion is formed at a position of the active layer, which is not in contact with the reducing pattern.

The reducing pattern may include at least one selected from a silicon nitride, a silicon oxynitride, a silicon oxide, a silicon hydrogen oxide, aluminum (Al), titanium (Ti), molybdenum (Mo), calcium (Ca) or barium (Ba).

The fabricating method may further comprise forming a gate insulating layer, wherein the gate insulating layer may be formed between the active layer and the gate electrode to cover the channel portion, the first conductorization portion and the second conductorization portion.

In another aspect of the present disclosure, the above and other aspects can be accomplished by the provision of a display device comprising the above-described thin film transistor.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
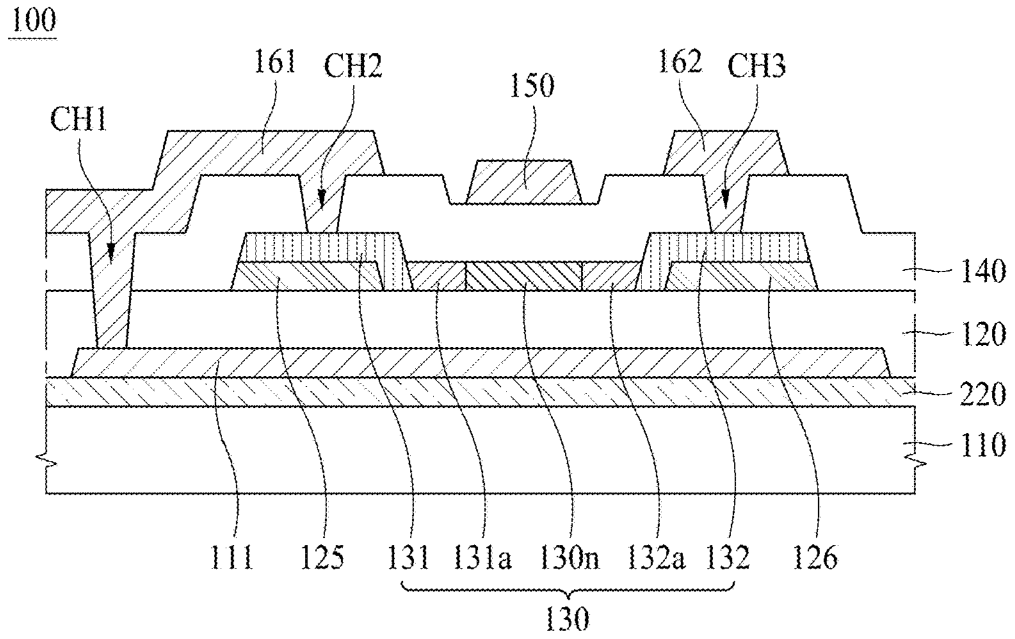
FIG. 1 is a cross-sectional view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor 100 according to one embodiment of the present disclosure.

The thin film transistor 100 according to one embodiment of the present disclosure includes reducing patterns 125 and 126 on a substrate 110, an active layer 130 that is in contact with the reducing patterns 125 and 126, and a gate electrode 150 partially overlapped with the active layer 130. The active layer 130 includes a channel portion **130*n*, a first conductorization portion 131 connected to one side of the channel portion 130*n*, and a second conductorization portion 132 connected to the other side of the channel portion 130*n*. According to one embodiment of the present disclosure, the channel portion 130*n* overlaps the gate electrode 150 but does not overlap the reducing patterns 125 and 126**.

Hereinafter, the thin film transistor 100 according to one embodiment of the present disclosure will be described in more detail with reference to FIG. 1.

The thin film transistor 100 may be disposed on the substrate 110. A support for supporting the thin film transistor 100 may be referred to as the substrate 110 without limitation.

Glass or plastic may be used as the substrate 110. A transparent plastic having a flexible property, for example, polyimide may be used as the plastic. When polyimide is used as the substrate 110, a heat-resistant polyimide capable of enduring a high temperature may be used considering that a high temperature deposition process is performed on the substrate 110.

A lower buffer layer 220 may be disposed on the substrate 110. The lower buffer layer 220 may protect the active layer 130 by shielding the air and water, and may planarize an upper surface of the substrate 110. The lower buffer layer 220 may be omitted.

A light shielding layer 111 is disposed on the lower buffer layer 220. When the lower buffer layer 220 is omitted, the light shielding layer 111 may be disposed on the substrate 110. The light shielding layer 111 overlaps the channel portion 130*n*. The light shielding layer 111 shields light incident from the outside to protect the channel portion 130*n*.

The light shielding layer 111 may be made of a material having light shielding characteristics. The light shielding layer 111 may include at least one of an aluminum-based metal such as aluminum (Al) or an aluminum alloy, a molybdenum-based metal such as molybdenum (Mo) or a molybdenum alloy, chromium (Cr), tantalum (Ta), neodymium (Nd), titanium (Ti), or iron (Fe). According to one embodiment of the present disclosure, the light shielding layer 111 may have electrical conductivity.

The light shielding layer 111 may be electrically connected to one of a source electrode 161 and a drain electrode 162. Also, the light shielding layer 111 may be electrically connected to a gate electrode 150. The light shielding layer 111 may be omitted.

A buffer layer 120 is disposed on the light shielding layer 111. The buffer layer 120 may be made of an insulating material. For example, the buffer layer 120 may include at least one of insulating materials such as a silicon oxide, a silicon nitride and a metal-based oxide. The buffer layer 120 may have a single layered structure, or may have a multi-layered structure.

The buffer layer 120 may protect the active layer 130 by shielding the air and water. Also, the upper surface of the substrate 110 on which the light shielding layer 111 is disposed may be planarized by the buffer layer 120.

The reducing patterns 125 and 126 are disposed on the buffer layer 120. Two reducing patterns 125 and 126 are shown in FIG. 1. According to one embodiment of the present disclosure, one of the reducing patterns 125 and 126 in a direction of the source electrode 161 may be referred to as the first reducing pattern 125, and the other one of the reducing patterns 125 and 126 in a direction of the drain electrode 162 may be referred to as the second reducing pattern 126. The positions of the first reducing pattern 125 and the second reducing pattern 126 may be reversed.

According to one embodiment of the present disclosure, the reducing patterns 125 and 126 may be disposed between the substrate 110 and the active layer 130.

The reducing patterns 125 and 126 have reductivity. A material that is in contact with the reducing patterns 125 and 126 may be reduced by the reducing patterns 125 and 126. A material having reductivity may be used as a material for forming the reducing patterns 125 and 126 without limitation.

According to one embodiment of the present disclosure, the reducing patterns 125 and 126 may include at least one selected from a silicon nitride, a silicon oxynitride, a silicon oxide, a silicon hydrogen oxide, aluminum (Al), titanium (Ti), molybdenum (Mo), calcium (Ca) or barium (Ba), but one embodiment of the present disclosure is not limited thereto. The reducing patterns 125 and 126 may include a material containing a large amount of hydrogen. The reducing patterns 125 and 126 may be made by metal deposition under the atmosphere of reductivity. In this case, the atmosphere of reductivity may be an atmosphere having a lower oxygen concentration than air or an atmosphere containing a large amount of hydrogen (H).

The active layer 130 is disposed on the reducing patterns 125 and 126.

According to one embodiment of the present disclosure, the active layer 130 may be formed by a semiconductor material. The active layer 130 may include, for example, an oxide semiconductor.

The active layer 130 may include at least one of, for example, an IZO(InZnO)-based, IGO(InGaO)-based, ITO (InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material, but one embodiment of the present disclosure is not limited thereto, and the active layer 130 may be made of another oxide semiconductor material known in the art.

The active layer 130 includes a channel portion 130*n*, a first conductorization portion 131 and a second conductorization portion 132.

The channel portion 130*n* overlaps the gate electrode 150. The channel portion 130*n* does not overlap the reducing patterns 125 and 126. In addition, the channel portion 130*n* is not in contact with the reducing patterns 125 and 126.

The first conductorization portion 131 and the second conductorization portion 132 of the active layer 130 do not overlap the gate electrode 150. The first conductorization portion 131 and the second conductorization portion 132 may be formed by selective conductorization of the semiconductor material. According to one embodiment of the present disclosure, the first conductorization portion 131 and the second conductorization portion 132 may be formed by conductorization of the area of the active layer 130, which is in contact with the reducing patterns 125 and 126.

According to one embodiment of the present disclosure, the first conductorization portion 131 of the active layer 130 may be a source area, and the second conductorization portion 132 may be a drain area. According to one embodiment of the present disclosure, the first conductorization portion 131 may be referred to as a source electrode, and the second conductorization portion 132 may be referred to as a drain electrode.

However, one embodiment of the present disclosure is not limited to the above example, and the first conductorization portion 131 may be a drain area, and the second conductorization portion 132 may be a source area. Also, the first conductorization portion 131 may be a drain electrode, and the second conductorization portion 132 may be a source electrode.

According to one embodiment of the present disclosure, the reducing patterns 125 and 126 are in contact with at least one of the first conductorization portion 131 or the second conductorization portion 132. Referring to FIG. 1, the reducing patterns 125 and 126 include a first reducing pattern 125 that is in contact with the first conductorization portion 131 and a second reducing pattern 126 that is in contact with the second conductorization portion 132.

According to one embodiment of the present disclosure, portions of the active layer 130, which are spaced apart from the channel portion 130*n* and are in contact with the reducing patterns 125 and 126, may be respectively reduced, so that the first conductorization portion 131 and the second conductorization portion 132 are made.

In detail, when a portion of the active layer 130, which is in contact with and overlaps the reducing patterns 125 and 126, is reduced, oxygen vacancy is generated in the active layer 130, whereby the active layer 130 may be selectively conductorized. The first conductorization portion 131 and the second conductorization portion 132 are made by such selective reduction and conductorization.

According to one embodiment of the present disclosure, the active layer 130 may be selectively conductorized by the reducing patterns 125 and 126 without a separate conductorization process such as plasma treatment, ion doping or ultraviolet treatment.

Since the reducing patterns 125 and 126 may be made by a method such as photolithography, elaborate reducing patterns 125 and 126 may be made. Since the reducing patterns 125 and 126 may be elaborately made, the first conductorization portion 131 and the second conductorization portion 132 of the active layer 130 may be also elaborately formed. Therefore, a length of the channel portion 130*n* may be elaborately controlled.

As described above, since the length of the channel portion 130*n* may be elaborately controlled, a process error for the length of the channel portion 130*n* may not be great during a fabricating process of the thin film transistor 100. As a result, a short channel portion 130*n* may be formed, so that a size of the thin film transistor 100 may be reduced, and the degree of integration of a device may be improved.

Also, since the length of the channel portion 130*n* may be elaborately controlled, an edge of the channel portion 130*n* may be prevented from being unnecessarily conductorized. Therefore, variation of a threshold voltage due to the conductorization of the edge of the channel portion 130*n* may be avoided. As a result, reliability of the thin film transistor 100 may be improved.

According to one embodiment of the present disclosure, diffusion portions 131*a* and 132*a* may be disposed between the channel portion 130*n* and the conductorization portions 131 and 132. For example, the active layer 130 may include at least one of a first diffusion portion 131*a* between the channel portion 130*n* and the first conductorization portion 131 or a second diffusion portion 132*a* between the channel portion 130*n* and the second conductorization portion 132.

FIG. 1 illustrates a configuration in which the active layer 130 includes both the first diffusion portion 131*a* and the second diffusion portion 132*a*. The first diffusion portion 131*a* may be in contact with the channel portion 130*n* and the first conductorization portion 131. The second diffusion portion 132*a* may be in contact with the channel portion 130*n* and the second conductorization portion 132.

According to one embodiment of the present disclosure, the diffusion portions 131*a* and 132*a* are disposed between the channel portion 130*n* and the conductorization portions 131 and 132 respectively, and do not overlap the gate electrode 150.

The diffusion portions 131*a* and 132*a* are not directly in contact with the reducing patterns 125 and 126, and do not overlap the reducing patterns 125 and 126. In the process of forming the conductorization portions 131 and 132 by the reducing patterns 125 and 126, oxygen vacancy is diffused, so that the diffusion portions 131*a* and 132*a* are formed. The diffusion portions 131*a* and 132*a* have electrical characteristics of the channel portion 130*n* and the conductorization portions 131 and 132 (see FIGS. 7 and 8).

Figure 7:
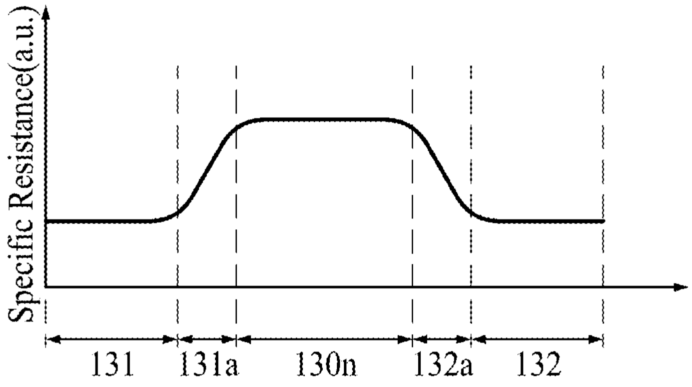
FIG. 7 is a schematic view illustrating the degree of specific resistance for each area of an active layer.

According to one embodiment of the present disclosure, specific resistance of the diffusion portions 131*a* and 132*a* is lower than that of the channel portion 130*n*, and is higher than that of the conductorization portions 131 and 132 (see FIG. 7). The diffusion portions 131*a* and 132*a* having the specific resistance characteristics serves as a buffer between the conductorization portions 131 and 132 and the channel portion 130*n*.

The diffusion portions 131*a* and 132*a* may serve to protect the channel portion 130*n*. For example, the diffusion portions 131*a* and 132*a* may prevent hydrogen or the like included in the reducing patterns 125 and 126 or another insulating layer from being diffused to the channel portion 130*n*, thereby preventing the channel portion 130*n* from being unnecessarily conductorized.

When the channel portion 130*n* is directly connected to the conductorization portions 131 and 132, oxygen vacancy occurs at the edge of the channel portion 130*n*, thereby increasing variation of the threshold voltage of the thin film transistor 100.

Also, when the channel portion 130*n* is directly connected to the conductorization portions 131 and 132, a leakage current may occur when the thin film transistor 100 is in an OFF-state. However, when the diffusion portions 131*a* and 132*a* having specific resistance greater than that of the conductorization portions 131 and 132 are disposed between the conductorization portions 131 and 132 and the channel portion 130*n*, the leakage current may be prevented from occurring between the channel portion 130*n* and the conductorization portions 131 and 132 when the thin film transistor 100 is in the OFF-state.

According to one embodiment of the present disclosure, even though a gate voltage is applied to the gate electrode 150 so that the thin film transistor 100 is in an ON-state, the thin film transistor 100 is not greatly affected by an electric field generated by the gate electrode 150. Therefore, due to the diffusion portions 131*a* and 132*a*, the threshold voltage of the thin film transistor 100 may be prevented from being shifted or may be less shifted.

In addition, since the specific resistance of the diffusion portions 131*a* and 132*a* is less than that of the channel portion 130*n*, the diffusion portions 131*a* and 132*a* do not disturb a flow of a current Ips in a state that the thin film transistor is in an ON-state.

In this way, the diffusion portions 131*a* and 132*a* not only protect the channel portion 130*n* but also serve as buffers between the conductorization portions 131 and 132 and the channel portion 130*n* to improve electrical stability of the channel portion 130*n*. Further, the diffusion portions 131*a* and 132*a* may prevent the leakage current of the thin film transistor 100 from occurring and prevent the threshold voltage from being shifted without disturbing driving of the thin film transistor 100.

According to one embodiment of the present disclosure, widths of the diffusion portions 131*a* and 132*a* are determined to prevent the leakage current of the thin film transistor 100 from occurring and prevent the threshold voltage from being shifted, without disturbing the driving of the thin film transistor 100.

For example, the widths of the first and second diffusion portions 131*a* and 132*a* may be designed in the range of 1 μm to 3 μm, respectively. The widths of the first and second diffusion portions 131*a* and 132*a* are defined by a distance between the channel portion 130*n* and the first conductorization portion 131 and a distance between the channel portion 130*n* and the second conductorization portion 132.

A gate insulating layer 140 is disposed on the active layer 130. The gate insulating layer 140 may include at least one of a silicon oxide, a silicon nitride or a metal-based oxide. The gate insulating layer 140 may have a single layered structure, or may have a multi-layered structure. The gate insulating layer 140 protects the channel portion 130*n*.

Referring to FIG. 1, the gate insulating layer 140 may be integrally formed on the substrate 110. For example, the gate insulating layer 140 may cover both the channel portion 130*n*, the first conductorization portion 131 and the second conductorization portion 132. The gate insulating layer 140 may cover the first diffusion portion 131*a* and the second diffusion portion 132*a*.

However, one embodiment of the present disclosure is not limited to the above example, and the gate insulating layer 140 may be patterned. For example, the gate insulating layer 140 may be patterned in a shape corresponding to the gate electrode 150.

The gate electrode 150 is disposed on the gate insulating layer 140. The gate electrode 150 overlaps the channel portion 130*n* of the active layer 130.

The gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 150 may have a multi-layered structure that includes at least two conductive layers having their respective physical properties different from each other.

Referring to FIG. 1, the reducing patterns 125 and 126 do not overlap the gate electrode 150. Also, the first diffusion portion 131*a* and the second diffusion portion 132*a* do not overlap the gate electrode 150.

According to one embodiment of the present disclosure, the thin film transistor 100 includes the source electrode 161 and the drain electrode 162. The source electrode 161 is electrically connected to the active layer 130. The drain electrode 162 is spaced apart from the source electrode 161 and electrically connected to the active layer 130. Referring to FIG. 1, the source electrode 161 and the drain electrode 162 are disposed on the gate insulating layer 140. In this case, the source electrode 161 and the drain electrode 162 may be made of the same material as that of the gate electrode 150. The source electrode 161 and the drain electrode 162 may be disposed on the same layer as the gate electrode 150.

Referring to FIG. 1, the source electrode 161 may be connected to the light shielding layer 111 through a contact hole CH1. Also, the source electrode 161 is connected to the active layer 130 through a contact hole CH2. In detail, the source electrode 161 may be electrically connected to the first conductorization portion 131 of the active layer 130 through the contact hole CH2. The source electrode 161 may contact the first conductorization portion 131 through a contact hole CH2.

The drain electrode 162 is spaced apart from the source electrode 161 and then connected to the active layer 130 through a contact hole CH3. In detail, the drain electrode 162 may be electrically connected to the second conductorization portion 132 of the active layer 130 through the contact hole CH3. The drain electrode 162 may contact the second conductorization portion 132 through a contact hole CH3.

Each of the source electrode 161 and the drain electrode 162 may include at least one of molybdenum (Mo), aluminum (Al), chromium (Cr), gold (Au), titanium (Ti), nickel (Ni), neodymium (Nd), copper (Cu) or their alloy. Each of the source electrode 161 and the drain electrode 162 may be made of a single layer made of a metal or an alloy of a metal, or may be made of two or more layers.

Referring to FIG. 1, the first conductorization portion 131 and the source electrode 161 are shown to be distinguished from each other, but one embodiment of the present disclosure is not limited thereto, and the first conductorization portion 131 may be a source electrode, and an electrode represented by a reference numeral "161" may be a connection electrode or a bridge.

Referring to FIG. 1, the second conductorization portion 132 and the drain electrode 162 are shown to be distinguished from each other, but one embodiment of the present disclosure is not limited thereto, and the second conductorization portion 132 may be a drain electrode and an electrode represented by a reference numeral "162" may be a connection electrode or a bridge.

Figure 2:
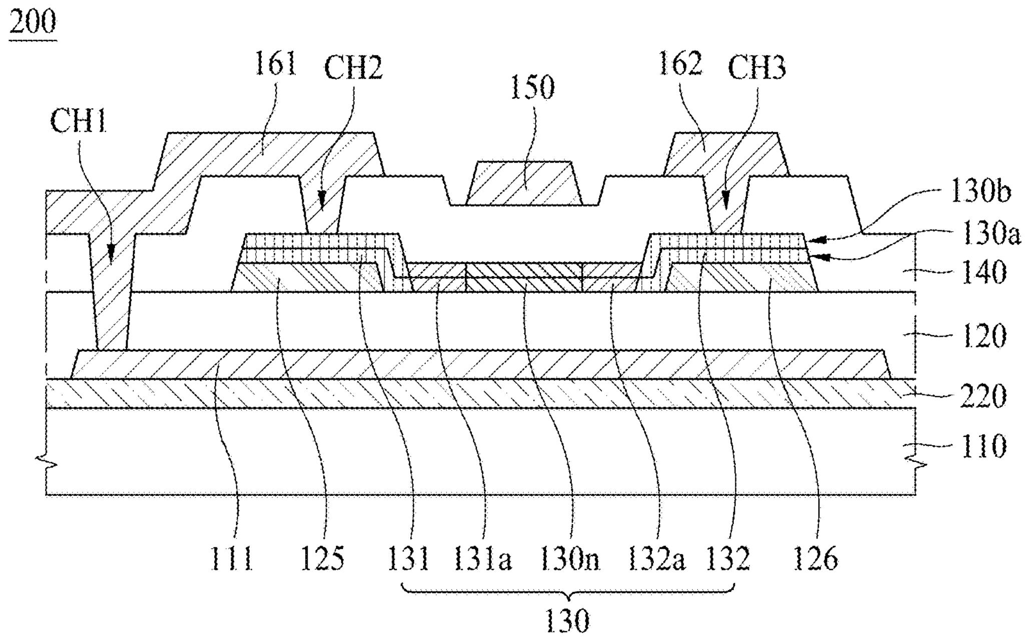
FIG. 2 is a cross-sectional view illustrating a thin film transistor according to another embodiment of the present disclosure.

FIG. 2 is a cross-sectional view illustrating a thin film transistor 200 according to another embodiment of the present disclosure. The thin film transistor 200 of FIG. 2 has a multi-layered structure as compared with the thin film transistor 100 of FIG. 1.

Referring to FIG. 2, the active layer 130 includes a first oxide semiconductor layer 130*a* and a second oxide semiconductor layer 130*b* on the first oxide semiconductor layer 130*a*. The first oxide semiconductor layer 130*a* and the second oxide semiconductor layer 130*b* may include the same semiconductor material, or may include their respective semiconductor materials different from each other.

The first oxide semiconductor layer 130*a* supports the second oxide semiconductor layer 130*b*. Therefore, the first oxide semiconductor layer 130*a* is referred to as a "support layer". The channel portion 130*n* may be formed in the second oxide semiconductor layer 130*b*. Therefore, the second oxide semiconductor layer 130*b* is referred to as a "channel layer", but one embodiment of the present disclosure is not limited thereto, and the channel portion 130*n* may be formed in the first oxide semiconductor layer 130*a*.

A structure in which the active layer 130 includes a first oxide semiconductor layer 130*a* and a second oxide semiconductor layer 130*b* is referred to as a bi-layer structure.

Figure 3:
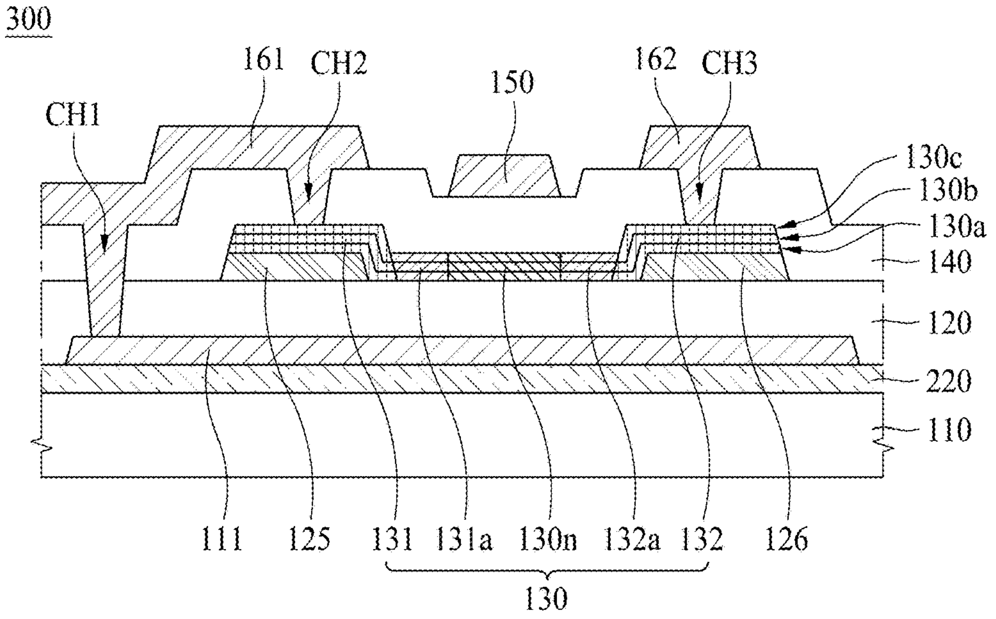
FIG. 3 is a cross-sectional view illustrating a thin film transistor according to still another embodiment of the present disclosure.

FIG. 3 is a cross-sectional view illustrating a thin film transistor 300 according to still another embodiment of the present disclosure. In the thin film transistor 300 of FIG. 3, the active layer further includes a third oxide semiconductor layer 130*c* on the second oxide semiconductor layer 130*b* as compared with the thin film transistor 200 of FIG. 2.

Referring to FIG. 3, the active layer 130 includes a first oxide semiconductor layer 130*a*, a second oxide semiconductor layer 130*b* and a third oxide semiconductor layer 130*c*, but another embodiments of the present disclosure are not limited thereto, and the active layer 130 may further include another semiconductor layer.

Figure 4:
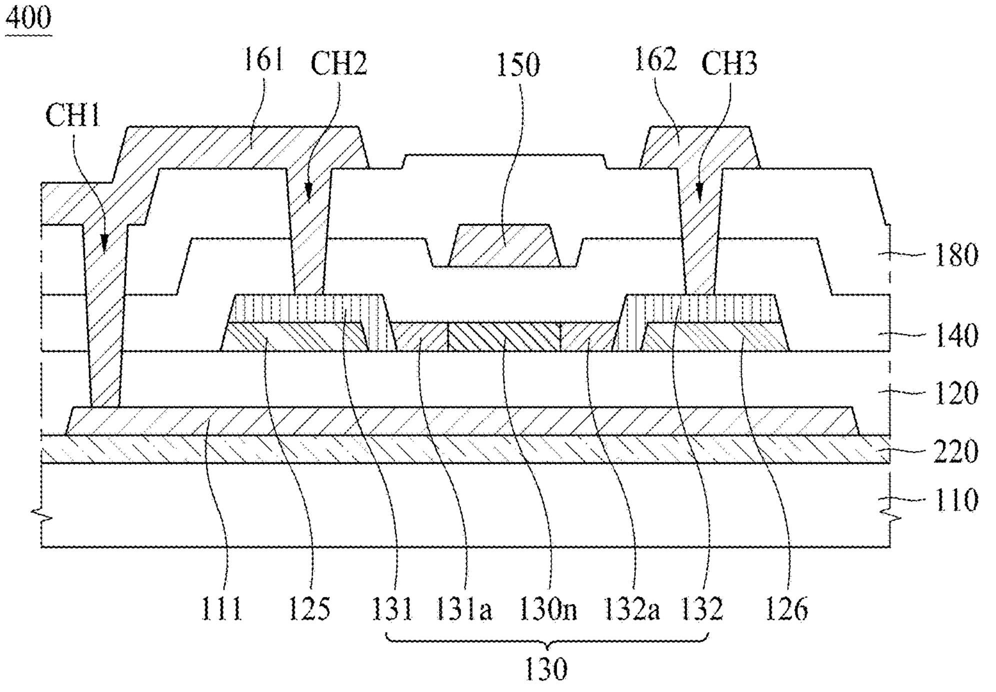
FIG. 4 is a cross-sectional view illustrating a thin film transistor according to further still another embodiment of the present disclosure.

FIG. 4 is a cross-sectional view illustrating a thin film transistor 400 according to further still another embodiment of the present disclosure.

Referring to FIG. 4, an interlayer insulating layer 180 is disposed on the gate insulating layer 140 and the gate electrode 150. The interlayer insulating layer 180 is an insulating layer made of an insulating material. The interlayer insulating layer 180 may be made of an organic material, or may be made of an inorganic material, or may be made of a stacked body of an organic layer and an inorganic layer. The source electrode 161 and the drain electrode 162 may be disposed on the interlayer insulating layer 180.

Figure 5:
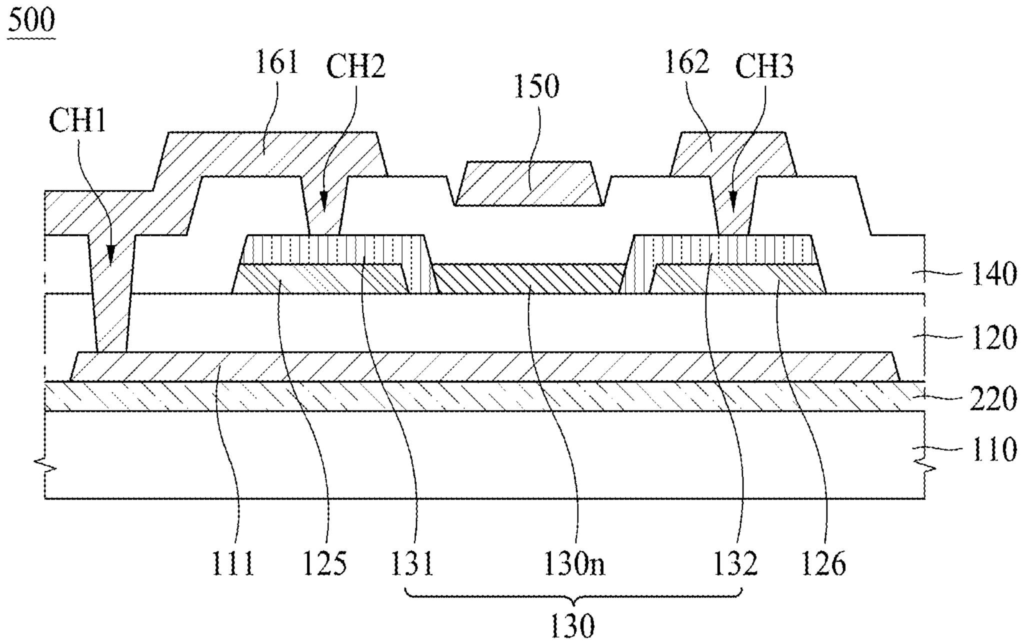
FIG. 5 is a cross-sectional view illustrating a thin film transistor according to further still another embodiment of the present disclosure.

FIG. 5 is a cross-sectional view illustrating a thin film transistor 500 according to further still another embodiment of the present disclosure. The thin film transistor 500 of FIG. 5 does not include a first diffusion portion 131*a* and a second diffusion portion 132*a*, as compared with the thin film transistor 100 of FIG. 1.

Figure 6:
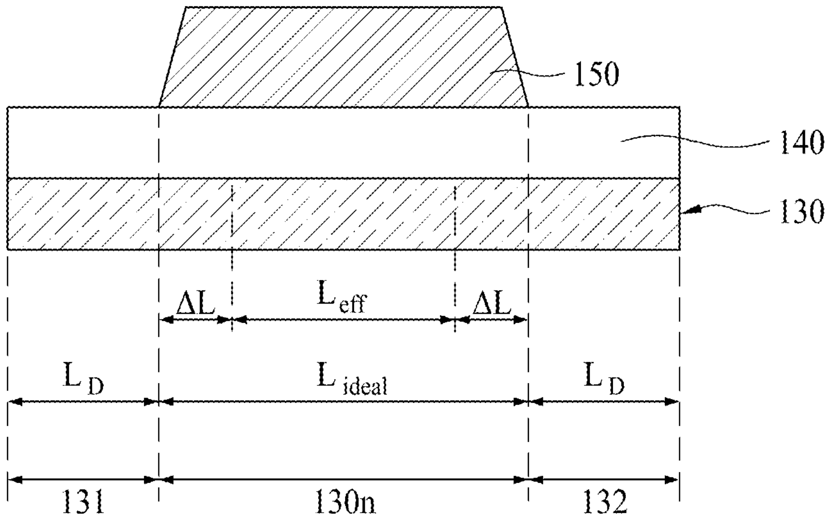
FIG. 6 is a schematic view illustrating a conductorization permeation depth ΔL of a channel portion.

FIG. 6 is a schematic diagram illustrating a conductorization permeation depth ΔL of a channel portion.

In the process of forming the active layer 130 during the fabricating process of the thin film transistor 100, an area designed as the channel portion 130*n* may be partially conductorized so that a portion, which cannot serve as a channel, may be generated. According to one embodiment of the present disclosure, the portion of the area designed as the channel portion 130*n*, which is conductorized so as not to serve as a channel, has a length that is referred to as a conductorization permeation depth ΔL.

Referring to FIG. 6, a length of the channel portion 130*n* in the active layer 130, which is overlapped with the gate electrode 150, is represented by "$L_{ideal}$". "$L_{ideal}$" in FIG. 6 may be referred to as an ideal length of the channel portion 130*n*. In FIG. 6, "LD" denotes a length of the first conductorization portion 131 or the second conductorization portion 132.

A portion of the area designed as the channel portion 130*n* may be unnecessarily conductorized during the selective conductorization process for the active layer 130, and the conductorized area does not serve as a channel. In FIG. 6, a conductorization permeation depth, which is the length of the conductorized portion of the channel portion 130*n*, is represented by "ΔL". Also, the length of the area of the channel portion 130*n*, which is not conductorized and may effectively serve as a channel, is referred to as an effective channel length $L_{eff}$. When the conductorization permeation depth ΔL is increased, the effective channel length $L_{eff}$ becomes smaller.

The thin film transistor should have an effective channel length $L_{eff}$ of a predetermined length or more in order to perform necessary functions. However, when the conductorization permeation depth ΔL is increased, the length of the channel portion 130*n* or a design length of the channel portion 130*n* should be increased to make sure of the effective channel length $L_{eff}$. In this way, when the length of the channel portion 130*n* is increased, it is difficult to miniaturize and integrate the device.

According to one embodiment of the present disclosure, the diffusion portions 131*a* and 132*a* not only protect the channel portion 130*n* but also serve as buffers between the conductorization portions 131 and 132 and the channel portion 130*n* to improve electrical stability of the channel portion 130*n*. Since the conductorization permeation depth ΔL is little or very small due to the presence of the diffusion portions 131*a* and 132*a*, it is easy to make sure of the effective channel length. As a result, the thin film transistor may be driven even by a short channel having the channel portion 130*n* of a short length, and a short channel may be implemented. In addition, design accuracy of the channel portion 130*n* is improved, and the design of the channel portion 130*n* is facilitated.

FIG. 7 is a schematic view illustrating the degree of specific resistance for each area of an active layer 130.

Referring to FIG. 7, the specific resistance of the diffusion portions 131*a* and 132*a* is lower than that of the channel portion 130*n*, and is higher than that of the conductorization portions 131 and 132. The diffusion portions 131*a* and 132*a* may have a specific resistance gradient that is lowered along a direction from the channel portion 130*n* toward the conductorization portions 131 and 132. The diffusion portions 131*a* and 132*a* may serve as electrical buffers between the conductorization portions 131 and 132 and the channel portion 130*n* that is conductorized.

In detail, since the diffusion portions 131*a* and 132*a* are positioned between the channel portion 130*n* and the conductorization portions 131 and 132, a leakage current may be prevented from flowing between the channel portion 130*n* and the conductorization portions 131 and 132 in an OFF-state of the thin film transistor 100. In this way, when the thin film transistor 100 is in an OFF-state, the diffusion portions 131*a* and 132*a* may prevent the leakage current from being generated in the thin film transistor 100.

Figure 8:
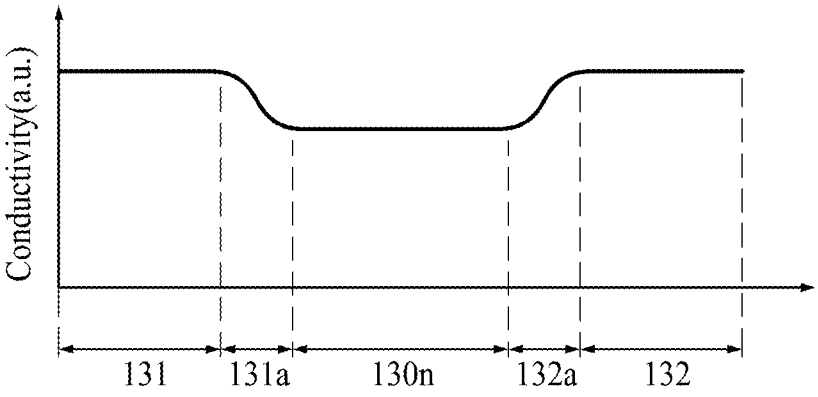
FIG. 8 is a schematic view illustrating distribution of electrical conductivity per area of an active layer in an ON-state of a thin film transistor.

FIG. 8 is a schematic view illustrating distribution of electrical conductivity per area of an active layer 130 in an ON-state of a thin film transistor.

When the gate voltage is applied to the gate electrode 150 so that the thin film transistor 100 is in an ON-state, electrical conductivity of the channel portion 130*n* is increased, but electrical conductivity of the diffusion portions 131*a* and 132*a* which are not affected by the electric field generated by the gate electrode 150 is not greatly increased. Therefore, when the thin film transistor 100 is in an ON-state, electrical conductivity of the diffusion portions 131*a* and 132*a* may be lower than that of the channel portion 130*n* and the conductorization portions 131 and 132. Due to the diffusion portions 131*a* and 132*a*, the threshold voltage may be prevented from being shifted in the thin film transistor 100. Therefore, electrical stability of the thin film transistor 100 is improved.

Hereinafter, a fabricating method of a thin film transistor 100 according to one embodiment of the present disclosure will be described with reference to FIGS. 9A to 9D.

FIGS. 9A to 9D are schematic views illustrating a fabricating method of a thin film transistor 100 according to one embodiment of the present disclosure.

According to one embodiment of the present disclosure, in order to fabricate the thin film transistor 100, reducing patterns 125 and 126 are formed on a substrate 110.

Figure 9A:
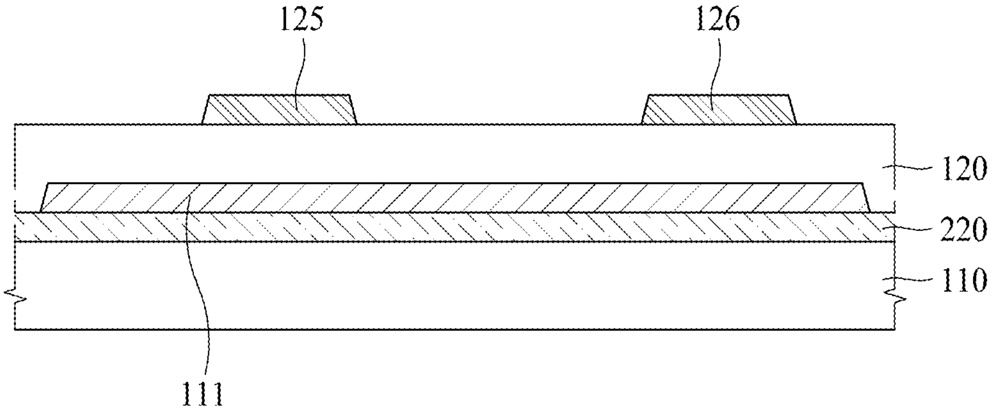
FIGS. 9A to 9D are schematic views illustrating a fabricating method of a thin film transistor according to one embodiment of the present disclosure.

In more detail, as shown in FIG. 9A, a lower buffer layer 220 may be formed on the substrate 110, a light shielding layer 111 may be formed on the lower buffer layer 220, a buffer layer 120 may be formed on the light shielding layer 111, and the reducing pattern 125 and 126 may be formed on the buffer layer 120.

The reducing patterns 125 and 126 are made of a reducing material. A material having reductivity may be used as a material for forming the reducing patterns 125 and 126 without limitation.

According to one embodiment of the present disclosure, the reducing patterns 125 and 126 may include at least one selected from a silicon nitride, a silicon oxynitride, a silicon oxide, a silicon hydrogen oxide, aluminum (Al), titanium (Ti), molybdenum (Mo), calcium (Ca) or barium (Ba), but one embodiment of the present disclosure is not limited thereto. The reducing patterns 125 and 126 may include a material containing a large amount of hydrogen.

According to one embodiment of the present disclosure, a film forming process such as deposition or sputtering is performed under the atmosphere of reductivity, so that the reducing patterns 125 and 126 may be made. In this case, the atmosphere of reductivity refers to an atmosphere having a lower oxygen concentration than air or an atmosphere containing a large amount of hydrogen (H).

Figure 9B:
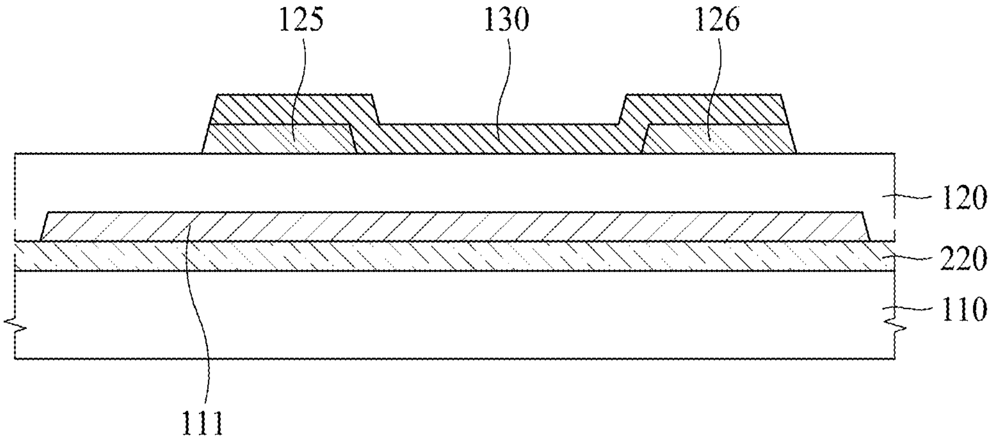

Referring to FIG. 9B, an active layer 130 is formed on the reducing patterns 125 and 126. The active layer 130 is formed to be partially in contact with the reducing patterns 125 and 126. A portion of the active layer 130 may be disposed to overlap the reducing patterns 125 and 126.

The active layer 130 that is in contact with the reducing patterns 125 and 126 is selectively conductorized by the reducing patterns 125 and 126. After the active layer 130 is formed on the reducing patterns 125 and 126, selective conductorization of the active layer 130 may be performed.

Figure 9C:
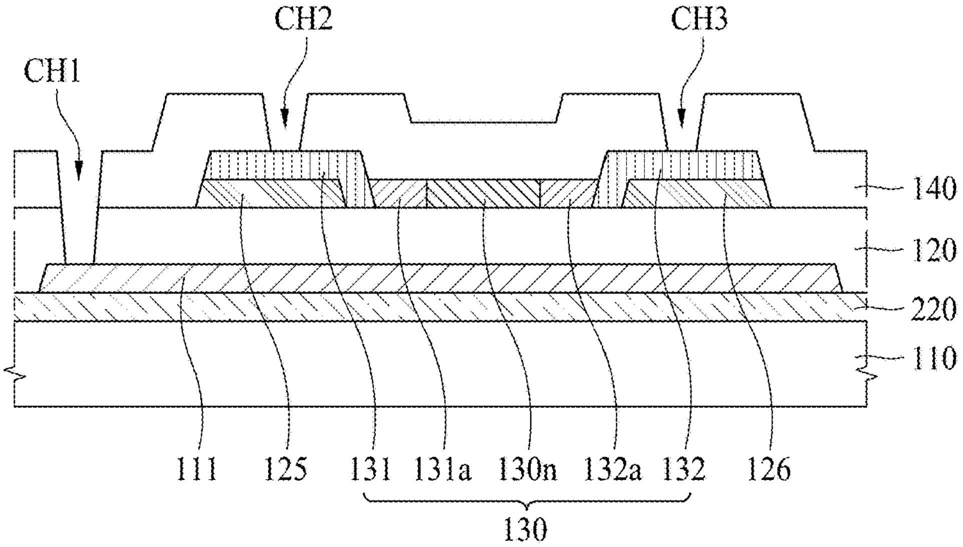

Referring to FIG. 9C, the active layer 130 is selectively conductorized by contact with the reducing patterns 125 and 126, whereby the first conductorization portion 131 and the second conductorization portion 132 are formed. A portion of the active layer 130, which is in contact with the first reducing pattern 125, becomes the first conductorization portion 131, and a portion of the active layer 130, which is in contact with the second reducing pattern 126, becomes the second conductorization portion 132.

The channel portion 130*n* is a portion that is not in contact with the reducing patterns 125 and 126 of the active layer 130 to maintain the semiconductor characteristics.

As described above, the active layer 130 including the channel portion 130*n*, the first conductorization portion 131 connected to one side of the channel portion 130*n* and the second conductorization portion 132 connected to the other side of the channel portion 130*n* may be completed. The channel portion 130*n* is formed at a position of the active layer 130, which does not overlap and is in contact with the reducing patterns 125 and 126.

Referring to FIG. 9C, the diffusion portions 131*a* and 132*a* may be formed between the channel portion 130*n* and the conductorization portions 131 and 132. For example, the first diffusion portion 131*a* may be formed between the channel portion 130*n* and the first conductorization portion 131, and the second diffusion portion 132*a* may be formed between the channel portion 130*n* and the second conductorization portion 132. In the process of forming the conductorization portions 131 and 132 by the reducing patterns 125 and 126, oxygen vacancy may be diffused so that the diffusion portions 131*a* and 132*a* may be formed.

Referring to FIG. 9C, a gate insulating layer 140 is formed on the active layer 130. Contact holes CH1, CH2 and CH3 may be formed in the gate insulating layer 140. The contact hole CH1 may be formed by passing through the gate insulating layer 140 and the buffer layer 120.

According to one embodiment of the present disclosure, the gate insulating layer 140 is formed to cover all of the channel portion 130*n*, the first conductorization portion 131 and the second conductorization portion 132. The gate insulating layer 140 may also cover the first diffusion portion 131*a* and the second diffusion portion 132*a*.

Figure 9D:
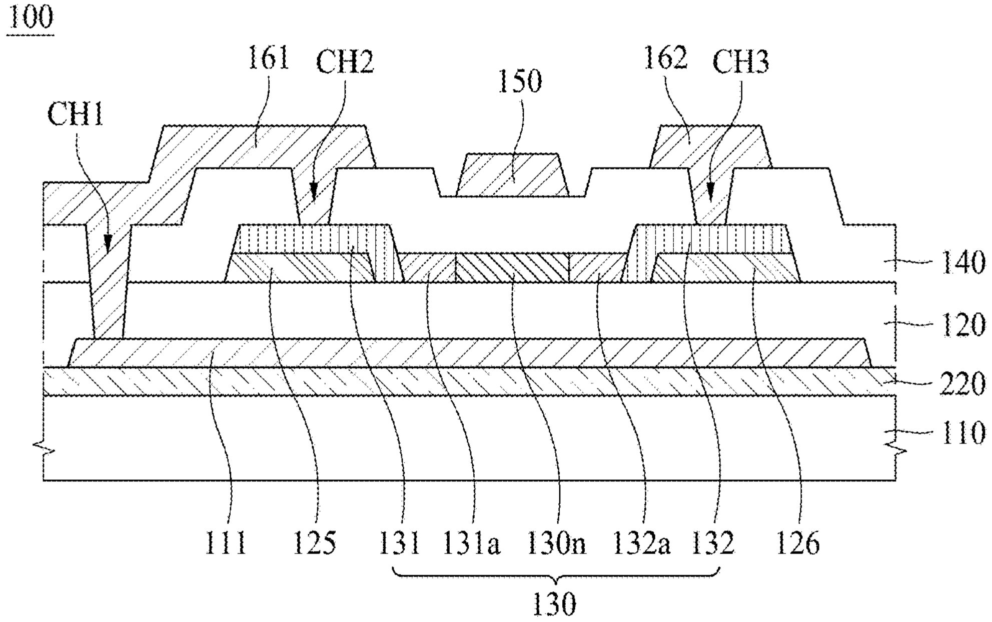

Referring to FIG. 9D, a gate electrode 150 is formed on the gate insulating layer 140. The gate electrode 150 at least partially overlaps the active layer 130. In detail, the gate electrode 150 is formed to overlap the channel portion 130*n*.

Referring to FIG. 9D, a source electrode 161 and a drain electrode 162 are formed on the gate insulating layer 140. In this case, the source electrode 161 and the drain electrode 162 may be made of the same material as that of the gate electrode 150 by the same process as that of the gate electrode 150.

Hereinafter, the display device comprising the above-described thin film transistors 100, 200, 300, 400 and 500 will be described in detail.

Figure 10:
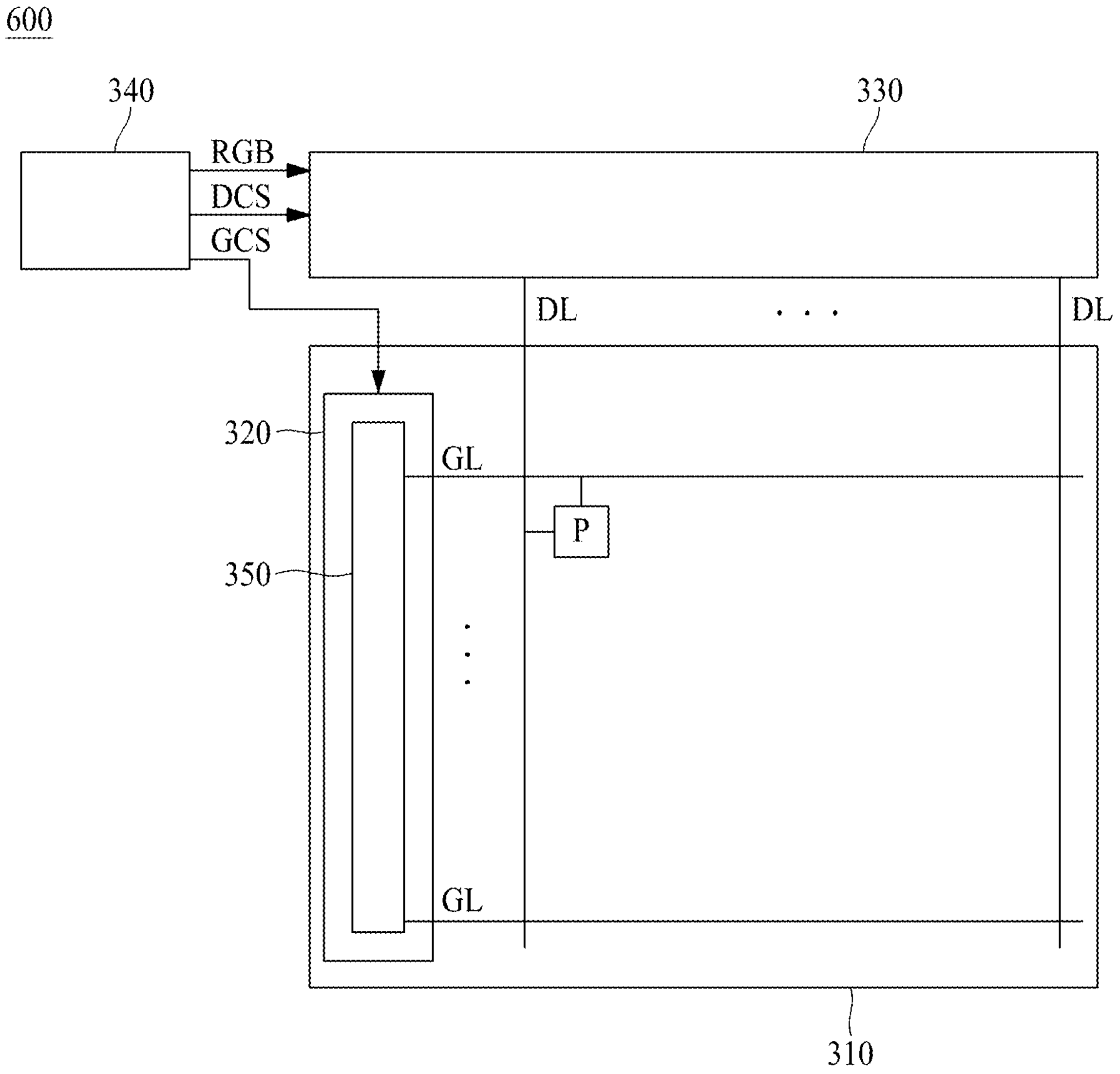
FIG. 10 is a schematic view illustrating a display device according to another embodiment of the present disclosure.

FIG. 10 is a schematic view illustrating a display device 600 according to another embodiment of the present disclosure.

As shown in FIG. 10, the display device 600 according to another embodiment of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a Gate In Panel (GIP) structure.

Figure 11:
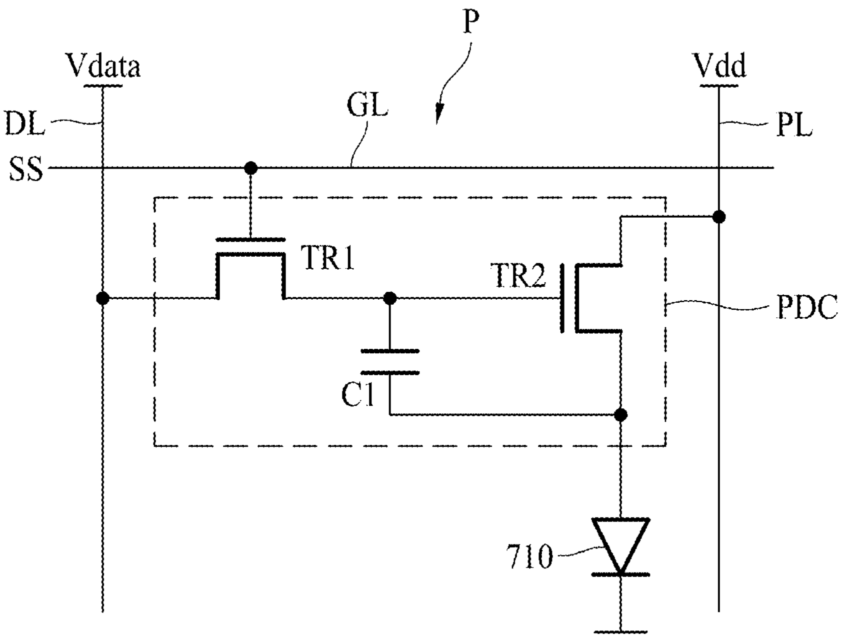
FIG. 11 is a circuit diagram illustrating any one pixel of FIG. 10.
Figure 12:
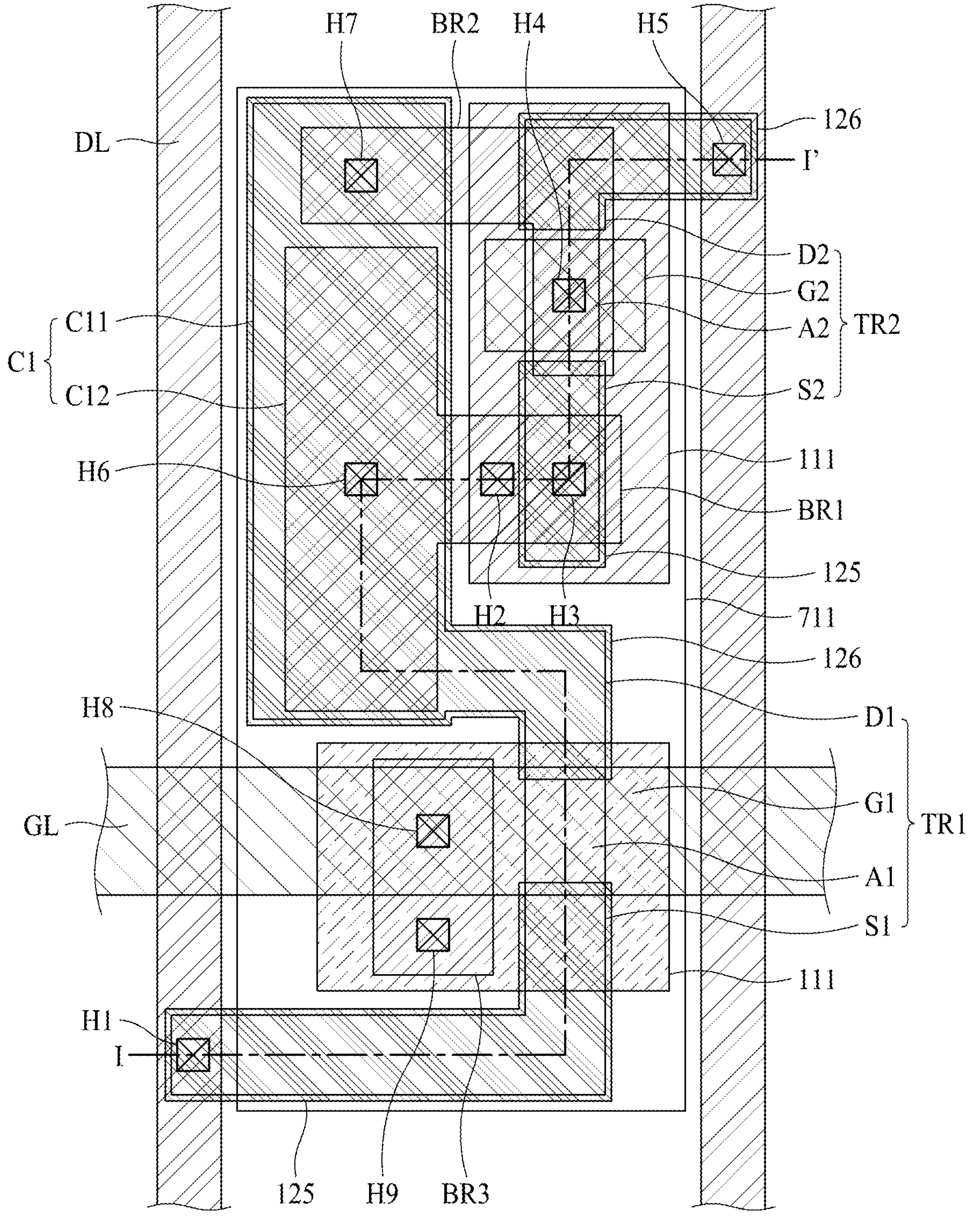
FIG. 12 is a plan view illustrating a pixel of FIG. 11.
Figure 13:
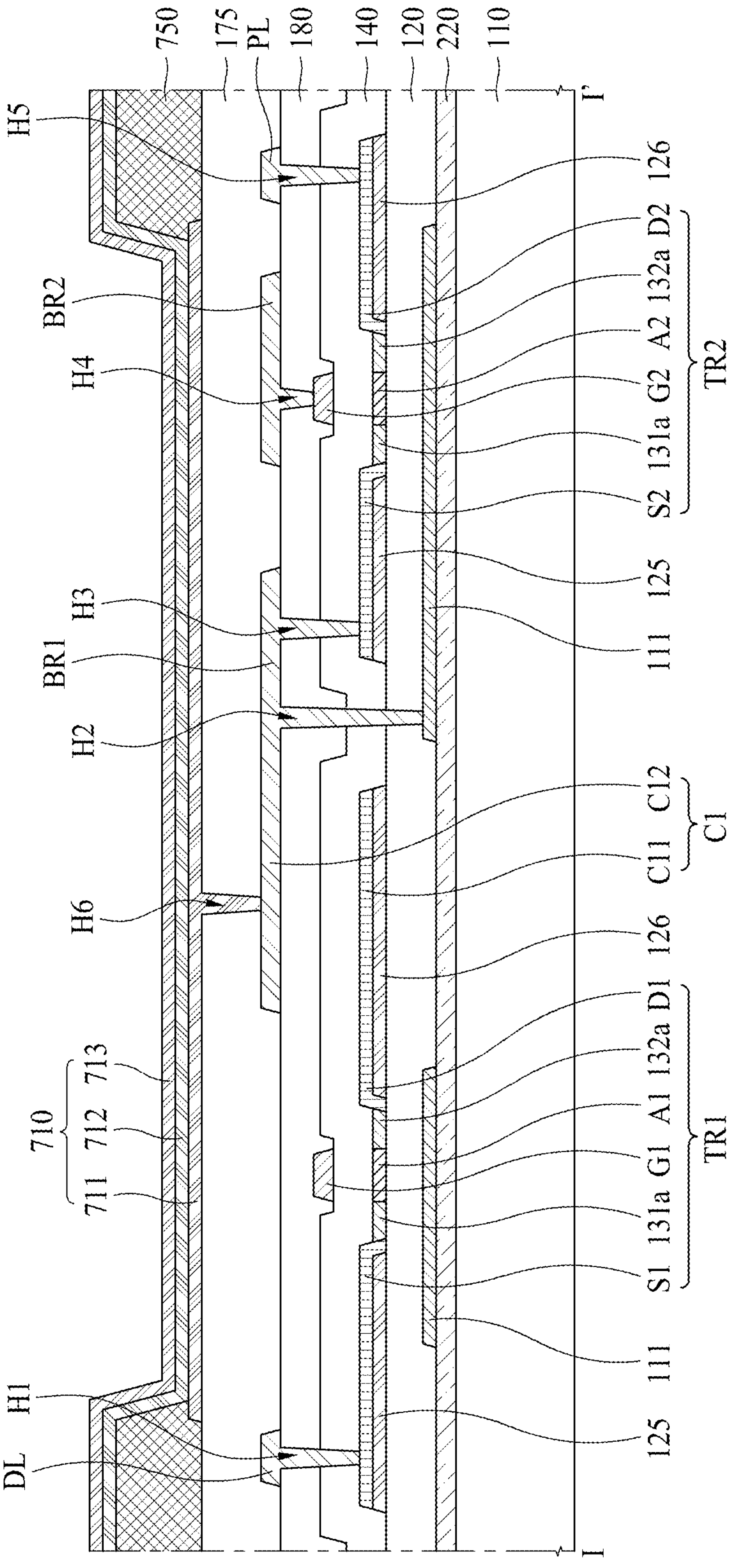
FIG. 13 is a cross-sectional view taken along line I-I' of FIG. 12.

FIG. 11 is a circuit diagram illustrating any one pixel P of FIG. 10, FIG. 12 is a plan view illustrating a pixel P of FIG. 11, and FIG. 13 is a cross-sectional view taken along line I-I' of FIG. 12.

The circuit diagram of FIG. 11 is an equivalent circuit diagram for the pixel P of the display device 600 that includes an organic light emitting diode (OLED) as a display element 710.

The pixel P includes a display element 710 and a pixel driving circuit PDC for driving the display element 710.

The pixel driving circuit PDC of FIG. 11 includes a first thin film transistor TR1 that is a switching transistor, and a second thin film transistor TR2 that is a driving transistor. For example, one of the thin film transistors 100, 200, 300, 400 and 500 described in the embodiments may be used as the first thin film transistor TR1 and the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 12 and 13, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A lower buffer layer 220 is disposed on the substrate 110, and a light shielding layer 111 is disposed on the lower buffer layer 220. The light shielding layer 111 may have light shielding characteristics. The light shielding layer 111 may shield light incident from the outside to protect active layers A1 and A2.

A buffer layer 120 is disposed on the light shielding layer 111. The buffer layer 120 is made of an insulating material, and protects the active layers A1 and A2 from external water or oxygen.

Reducing patterns 125 and 126 are disposed on the buffer layer 120. According to one embodiment of the present disclosure, the reducing patterns 125 and 126 have reductivity. Since the configuration and the functions of the reducing patterns 125 and 126 have been already described, their detailed description will be omitted to avoid redundancy.

The first active layer A1 of the first thin film transistor TR1 and the second active layer A2 of the second thin film transistor TR2 are disposed on the buffer layer 120 on the reducing patterns 125 and 126.

Each of the first active layer A1 and the second active layer A2 may include, for example, an oxide semiconductor material. Each of the first active layer A1 and the second active layer A2 may be made of an oxide semiconductor layer made of an oxide semiconductor material.

In the first thin film transistor TR1, the first active layer A1 may include a channel portion, a first conductorization portion, and a second conductorization portion. The channel portion of the first active layer A1 overlaps the gate electrode G1. According to another embodiment of the present disclosure, the first conductorization portion may be referred to as a first source electrode S1, and the second conductorization portion may be referred to as a first drain electrode D1.

In the second thin film transistor TR2, the second active layer A2 may include a channel portion, a first conductorization portion, and a second conductorization portion. The channel portion of the second active layer A2 overlaps the gate electrode G2. According to another embodiment of the present disclosure, the first conductorization portion may be referred to as a second source electrode S2, and the second conductorization portion may be referred to as a second drain electrode D2.

Referring to FIGS. 12 and 13, a portion of the first active layer A1 may be conductorized to become a first capacitor electrode C11 of the first capacitor C1. For example, the second conductorization portion of the first active layer A1, which serves as the first drain electrode D1, may serve as the first capacitor electrode C11.

A gate insulating layer 140 is disposed on the first active layer A1 and the second active layer A2. The gate insulating layer 140 may cover entire upper surfaces of the first active layer A1 and the second active layer A2.

The gate electrode G1 of the first thin film transistor TR1 and the gate electrode G2 of the second thin film transistor TR2 are disposed on the gate insulating layer 140.

The gate electrode G1 of the first thin film transistor TR1 at least partially overlaps the first active layer A1 of the first thin film transistor TR1. The gate electrode G2 of the second thin film transistor TR2 at least partially overlaps the second active layer A2 of the second thin film transistor TR2.

An interlayer insulating layer 180 is disposed on the gate electrodes G1 and G2.

The data line DL and the driving power line PL are disposed on the interlayer insulating layer 180.

The data line DL is in contact with the first source electrode S1 formed in the first active layer A1 through a first contact hole H1. According to another embodiment of the present disclosure, a portion of the data line DL overlapped with the first active layer A1 may be referred to as the first source electrode S1.

The driving power line PL is in contact with the second drain electrode D2 formed in the second active layer A2 through a fifth contact hole H5. According to another embodiment of the present disclosure, a portion of the driving power line PL overlapped with the second active layer A2 may be referred to as the second drain electrode D2.

Referring to FIGS. 12 and 13, a second capacitor electrode C12 of the first capacitor C1, a first bridge BR1 and a second bridge BR2 are disposed on the interlayer insulating layer 180.

The second capacitor electrode C12 overlaps the first capacitor electrode C11 to form the first capacitor C1.

The first bridge BR1 may be integrally formed with the second capacitor electrode C12. The first bridge BR1 is connected to the light shielding layer 111 through a second contact hole H2, and is connected to the second source electrode S2 through a third contact hole H3.

The second bridge BR2 is connected to the gate electrode G2 of the second thin film transistor TR2 through a fourth contact hole H4, and is connected to the first capacitor electrode C11 of the first capacitor C1 through a seventh contact hole H7.

Also, referring to FIG. 12, a third bridge BR3 is disposed on the interlayer insulating layer 180. The third bridge BR3 is connected to the gate line GL through an eighth contact hole H8 and thus connected to the first gate electrode A1, and is connected to the light shielding layer 111 of the first thin film transistor TR1 through a ninth contact hole H9. Although FIG. 12 illustrates that the light shielding layer 111 is connected to the first gate electrode A1, one embodiment of the present disclosure is not limited thereto, and the light shielding layer 111 may be also connected to the first source electrode S1 or the first drain electrode D1.

A planarization layer 175 is disposed on the data line DL, the driving power line PL, the second capacitor electrode C12, the first bridge BR1, the second bridge BR2, and the third bridge BR3. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 is in contact with the second capacitor electrode C12 integrally formed with the first bridge BR1 through a sixth contact hole H6 formed in the planarization layer 175. As a result, the first electrode 711 may be connected to the second source electrode S2 of the second thin film transistor TR2.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 13 is an organic light emitting diode (OLED). Therefore, the display device 100 according to one embodiment of the present disclosure is an organic light emitting display device.

Figure 14:
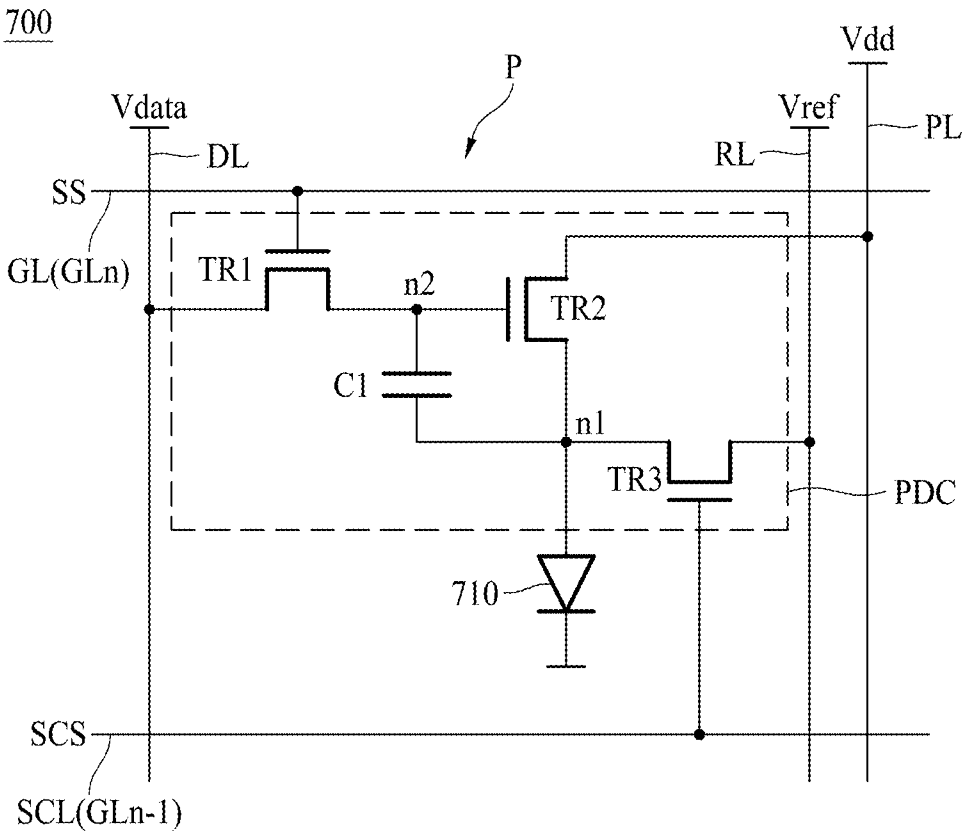
FIG. 14 is a circuit diagram illustrating any one pixel of a display device according to still another embodiment of the present disclosure.

FIG. 14 is a circuit diagram illustrating any one pixel P of a display device 700 according to still another embodiment of the present disclosure.

FIG. 14 is an equivalent circuit diagram illustrating a pixel P of an organic light emitting display device.

The pixel P of the display device 700 shown in FIG. 14 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 14, assuming that a gate line of an (n)th pixel P is "$GL_n$", a gate line of a (n−1)th pixel P adjacent to the (n)th pixel P is "$GL_{n-1}$", and the gate line "$GL_{n-1}$" of the (n−1)th pixel P serves as a sensing control line SCL of the (n)th pixel P.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is positioned between the gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 15:
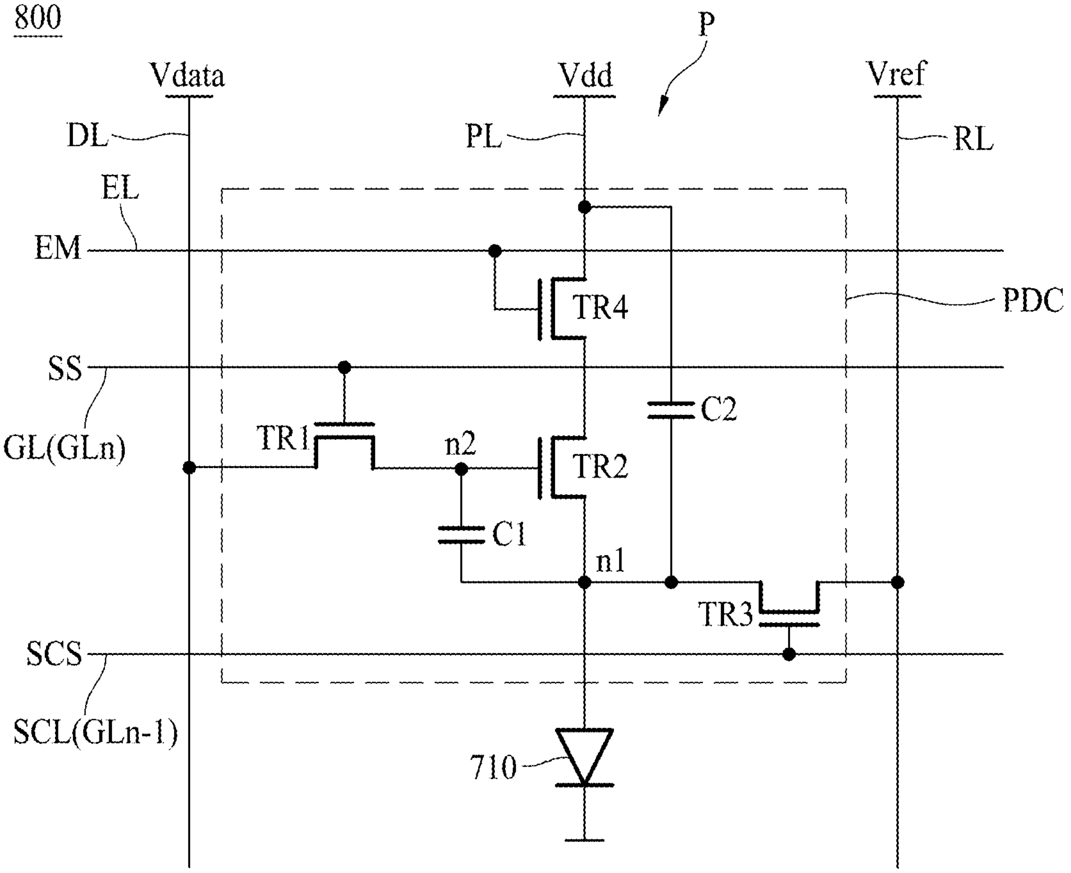
FIG. 15 is a circuit diagram illustrating any one pixel of a display device according to further still another embodiment of the present disclosure.

FIG. 15 is a circuit diagram illustrating a pixel of a display device 800 according to further still another embodiment of the present disclosure.

The pixel P of the display device 800 shown in FIG. 15 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 14, the pixel P of FIG. 15 further includes an emission control line EL. An emission control signal EM is supplied to the emission control line EL.

Also, the pixel driving circuit PDC of FIG. 15 further includes a fourth thin film transistor TR4 that is an emission control transistor for controlling a light emission timing of the second thin film transistor TR2, in comparison with the pixel driving circuit PDC of FIG. 14.

Referring to FIG. 15, assuming that a gate line of an (n)th pixel P is "$GL_n$", a gate line of a (n−1)th pixel P adjacent to the (n)th pixel P is "$GL_{n-1}$" and the gate line "$GL_{n-1}$" of the (n−1)th pixel P serves as a sensing control line SCL of the (n)th pixel P.

A first capacitor C1 is positioned between the gate electrode G2 of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

According to the present disclosure, the following advantageous effects may be obtained.

According to one embodiment of the present disclosure, since the active layer is selectively conductorized by the reducing patterns, the size and position of the conductorization portion may be elaborately controlled. Therefore, the length of the channel portion may be elaborately controlled, and the edge of the channel portion may be prevented from being unnecessarily conductorized, whereby the thin film transistor may have excellent reliability.

According to another embodiment of the present disclosure, the positions of the reducing patterns may be controlled so that the diffusion portion may be formed between the channel portion and the conductorization portion of the active layer. Due to the diffusion portion formed between the channel portion and the conductorization portion, the edge of the channel portion may be prevented from being unnecessarily conductorized, so that the channel length deviation and performance deviation of the thin film transistor may be avoided.

The display device comprising the thin film transistor according to one embodiment of the present disclosure may have excellent reliability.

It will be apparent to those skilled in the art that various modifications and variations can be made in the thin film transistor, the fabricating method thereof and the display device comprising the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A thin film transistor, comprising:
- a reducing pattern on a substrate;
- an active layer on the reducing pattern and in contact with the reducing pattern;
- a gate insulating layer on the active layer; and
- a gate electrode on the gate insulating layer and at least partially overlapped with the active layer,
- wherein the active layer includes:
  - a channel portion;
  - a first conductorization portion connected to one side of the channel portion;
  - a second conductorization portion connected to the other side of the channel portion, the channel portion being disposed between the first conductorization portion and the second conductorization portion in a first direction;
  - a first diffusion portion between the channel portion and the first conductorization portion; and
  - a second diffusion portion between the channel portion and the second conductorization portion,
- wherein the first diffusion portion and the second diffusion portion do not overlap the reducing pattern and do not contact the reducing pattern,
- wherein the channel portion overlaps the gate electrode, does not contact the reducing pattern, and does not overlap the reducing pattern,
- wherein the reducing pattern has a greater width than the active layer in a second direction perpendicular to the first direction in a plan view,
- wherein the active layer covers an entire upper surface of the reducing pattern in a cross-sectional view, and
- wherein the reducing pattern is disposed between the substrate and the active layer.

2. The thin film transistor of claim 1, wherein the reducing pattern is in contact with at least one of the first conductorization portion and the second conductorization portion.

3. The thin film transistor of claim 1, wherein the reducing pattern includes:
- a first reducing pattern that is in contact with the first conductorization portion; and
- a second reducing pattern that is in contact with the second conductorization portion.

4. The thin film transistor of claim 1, wherein the reducing pattern does not overlap the gate electrode.

5. The thin film transistor of claim 1, wherein the reducing pattern includes at least one of a silicon nitride, a silicon oxynitride, a silicon oxide, a silicon hydrogen oxide, aluminum (Al), titanium (Ti), molybdenum (Mo), calcium (Ca), and barium (Ba).

6. The thin film transistor of claim 1, wherein the first diffusion portion and the second diffusion portion do not overlap the gate electrode.

7. The thin film transistor of claim 1, wherein:
- the first diffusion portion has a specific resistance smaller than a resistance of the channel portion and greater than a resistance of the first conductorization portion, and
- the second diffusion portion has a specific resistance smaller than the resistance of the channel portion and greater than a resistance of the second conductorization portion.

8. The thin film transistor of claim 1, wherein the gate insulating layer covers the channel portion, the first diffusion portion, the second diffusion portion, the first conductorization portion, and the second conductorization portion.

9. The thin film transistor of claim 1, wherein the active layer includes an oxide semiconductor material.

10. The thin film transistor of claim 9, wherein the oxide semiconductor material includes at least one of an IZO (InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material.

11. The thin film transistor of claim 1, wherein the active layer includes:
- a first oxide semiconductor layer; and
- a second oxide semiconductor layer on the first oxide semiconductor layer.

12. The thin film transistor of claim 11, wherein the active layer further includes a third oxide semiconductor layer on the second oxide semiconductor layer.

13. The thin film transistor of claim 1, further comprising:
- a source electrode electrically connected to the active layer; and
- a drain electrode spaced apart from the source electrode and electrically connected to the active layer.

14. The thin film transistor of claim 13, wherein the source electrode and the drain electrode are disposed on the same layer as the gate electrode.

15. The thin film transistor of claim 13, wherein:
- the source electrode contacts the first conductorization portion through a contact hole, and
- the drain electrode contacts the second conductorization portion through another contact hole.

16. A display device comprising the thin film transistor of claim 1.

17. The thin film transistor of claim 1, wherein the gate insulating layer is disposed over an upper surface of the reducing pattern without contacting the upper surface of the reducing pattern in a cross-sectional view.

18. The thin film transistor of claim 1, wherein the reducing pattern includes an L shape in the plan view.

19. A fabricating method of a thin film transistor, the fabricating method comprises:

forming a reducing pattern on a substrate;

forming an active layer on the reducing pattern and in contact with the reducing pattern;

forming a gate insulating layer on the active layer; and forming a gate electrode on the gate insulating layer and at least partially overlapped with the active layer, wherein the active layer includes:

a channel portion;

a first conductorization portion connected to one side of the channel portion;

a second conductorization portion connected to the other side of the channel portion, the channel portion being disposed between the first conductorization portion and the second conductorization portion in a first direction;

a first diffusion portion between the channel portion and the first conductorization portion; and a second diffusion portion between the channel portion and the second conductorization portion, wherein the first diffusion portion and the second diffusion portion are formed not to overlap the reducing pattern and not to contact the reducing pattern, wherein the gate electrode is formed to overlap the channel portion, wherein the channel portion is formed at a position of the active layer, which is not in contact with the reducing pattern and does not overlap the reducing pattern, wherein the reducing pattern has a greater width than the active layer in a second direction perpendicular to the first direction in a plan view, wherein the active layer covers an entire upper surface of the reducing pattern in a cross-sectional view, and wherein the reducing pattern is formed to be between the substrate and the active layer.

20. The fabricating method of claim 19, wherein the reducing pattern includes at least one of a silicon nitride, a silicon oxynitride, a silicon oxide, a silicon hydrogen oxide, aluminum (Al), titanium (Ti), molybdenum (Mo), calcium (Ca), and barium (Ba).

21. The fabricating method of claim 19, wherein the gate insulating layer is formed between the active layer and the gate electrode to cover the channel portion, the first diffusion portion, the second diffusion portion, the first conductorization portion, and the second conductorization portion.

* * * * *